United States Patent
Varanasi

(10) Patent No.: US 6,674,375 B2
(45) Date of Patent: Jan. 6, 2004

(54) RUN LENGTH LIMITED CODING WITH MINIMAL ERROR PROPAGATION

(75) Inventor: Chandra Chuda Varanasi, Longmont, CO (US)

(73) Assignee: Seagate Technology LLC, Scotts Valley, CA (US)

(*) Notice: Subject to any disclaimer, the term of this patent is extended or adjusted under 35 U.S.C. 154(b) by 0 days.

(21) Appl. No.: 10/314,247

(22) Filed: Dec. 5, 2002

(65) Prior Publication Data

US 2003/0227399 A1 Dec. 11, 2003

Related U.S. Application Data

(60) Provisional application No. 60/387,007, filed on Jun. 7, 2002.

(51) Int. Cl.[7] .............................................. H03M 7/00
(52) U.S. Cl. ........................... 341/59; 341/51; 341/60; 341/61; 341/68
(58) Field of Search ......................... 341/68, 59, 67, 341/51, 55, 60, 61, 65, 69, 95

(56) References Cited

U.S. PATENT DOCUMENTS

| | | | | |
|---|---|---|---|---|
| 4,644,545 A | * | 2/1987 | Gershenson | 714/759 |
| 5,220,568 A | * | 6/1993 | Howe et al. | 714/782 |
| 5,537,112 A | * | 7/1996 | Tsang | 341/59 |
| 5,781,133 A | * | 7/1998 | Tsang | 341/59 |
| 6,198,582 B1 | | 3/2001 | Tsang et al. | 360/40 |
| 6,504,493 B1 | * | 1/2003 | Burd | 341/50 |
| 6,509,849 B2 | * | 1/2003 | von Wendorff | 341/58 |

* cited by examiner

*Primary Examiner*—Brian Young
*Assistant Examiner*—John Nguyen
(74) *Attorney, Agent, or Firm*—Merchant & Gould P.C.

(57) ABSTRACT

Systems and methods that encode and decode data in a manner that limits error propagation by parsing a data word of length n into a predetermined number of data blocks, individually encoding each data block into a single associated code block, and then combining each of the code blocks to form a resulting code word of length (n+1), resulting in a code rate of n/(n+1). By parsing and encoding the data word in this manner, errors that occur with respect to one or more bits of one code block will not be propagated throughout an entire data word during the decoding process.

25 Claims, 7 Drawing Sheets

RUN LENGTH LIMITED CODING WITH MINIMAL ERROR PROPAGATION

RELATED APPLICATIONS

This application claims priority of U.S. provisional application Serial No. 60/387,007, filed Jun. 7, 2002.

FIELD OF THE INVENTION

This application relates generally to encoding and decoding data, and more particularly to encoding and decoding data in a manner that reduces error propagation in the decoding process and that provides enhanced timing recovery features.

BACKGROUND OF THE INVENTION

In the field of digital communications, digital information is conveyed from a transmitter to a receiver through a channel. "Channel" is a generalized term that can include many things. For instance, in satellite communication systems, the channel consists of the atmosphere between an earth-bound transmitter and a satellite. In data storage devices, such as magnetic disc drives, the channel includes a storage medium where the signal is stored for some period of time before being delivered to the receiver.

To increase data density in or through the channel, and to detect and sometimes to correct errors caused by channel noise, the digital information may be subjected to various coding techniques. These coding techniques convert data words formed of "m" data bits into larger code words formed of "n" code bits. The ratio of the number of data bits to the number of code bits, m/n, is known as the code rate of the code.

In one type of coding, known as Non-Return-to-Zero Inverse (NRZI), every digital one in a code word represents a transition in the received signal, and every digital zero represents a lack of transitions in the received signal. To allow the receiver to generate a clock signal from the received signal, the encoded signal is generally limited so that the number of consecutive zeros is no greater than a maximum number "k". This kind of code is known as a run-length-limited (RLL) code with a "k" constraint.

To minimize the time and energy needed to send the coded data, the code rate should be maximized. To achieve higher code rates, the number of bits being encoded can be increased. For example, a 64/65 code has a higher code rate than a 17/18 code. As the code rate is increased, the complexity of the RLL code and its error propagation increases.

One technique that may be used to correct propagation of errors is to increase the complexity of the error correction circuitry used after the RLL decoder. Unfortunately, high complexity correction circuitry can greatly add to the cost of encoding/decoding systems. However, this technique does not address the issue of RLL code complexity.

Accordingly there is a need for systems and methods for encoding and decoding data in a manner that provides high code rates, sufficient signal transitions for timing recovery purposes, while minimizing the effects or likelihood of propagation errors in the decoding process. At the same time code rate should be maintained at the highest possible value of n/(n+1) where n is the length of the data word.

SUMMARY OF THE INVENTION

Against this backdrop the present invention has been developed. In general, the various encoding systems and methods described herein parse an n-bit data word into a predetermined number of data blocks, individually encoding or forming each data block into a code block that includes at least two binary ones, and then combining each of the code blocks to form a resulting (n+1)-bit code word. The resulting (n+1)-bit code word may then be decoded using the various reciprocal decoding systems and methods described herein.

DETAILED DESCRIPTION

The present disclosure describes various systems and methods for encoding and decoding data in a manner that limits error propagation in the decoding process. In general, the various encoding and decoding systems and methods described herein limit error propagation by parsing an n-bit data word into a predetermined number of data blocks, individually encoding each data block into a single associated code block, and then combining each of the code blocks to form a resulting (n+1)-bit code word. By parsing and encoding the data word in this manner, errors that occur with respect to one or more bits of one code block will not be propagated throughout an entire data word during the decoding processes. This reduction in error propagation allows for the use of less complex, and thus less costly, error correction mechanisms in the overall system.

In addition to reducing error propagation, the various systems and methods described herein enhance timing recovery by providing sufficient transitions in the encoded data. This enhanced timing recovery is achieved by ensuring that each code block in a code word includes at least two ones. In this sense, the encoding carried out by the various encoding and decoding systems and methods described herein may be thought of as a Run Length Limited (RLL), or simply Run Limited, encoding. Additionally, unlike typical RLL type encoding techniques, the various embodiments described herein al re not limited to a particular k-constraint or code rate. Rather, according to various embodiments described herein, a number of RLL codes may be constructed, each having a different code rate and/or k-constraint, while maintaining a high code rate value of n/(n+1), where n is the length of the data word.

One environment where the various systems and methods of the present invention are particularly useful is that of digital data storage. In particular, the various systems and methods the present invention may be advantageously used in the read/write channel of a disc drive, or other data storage device. As such, the basic components and features of a disc drive will now be described to provide an overview of one possible environment for various embodiments of the present invention. However, it should be understood that the methods and systems described herein are applicable to encoding and decoding data in numerous other types of data storage devices, data transmission systems, or communications channels. For example, and without limitation, the methods and systems described herein may be used in any communications system where data and clock signals are carried in the same signal.

Figure 1:
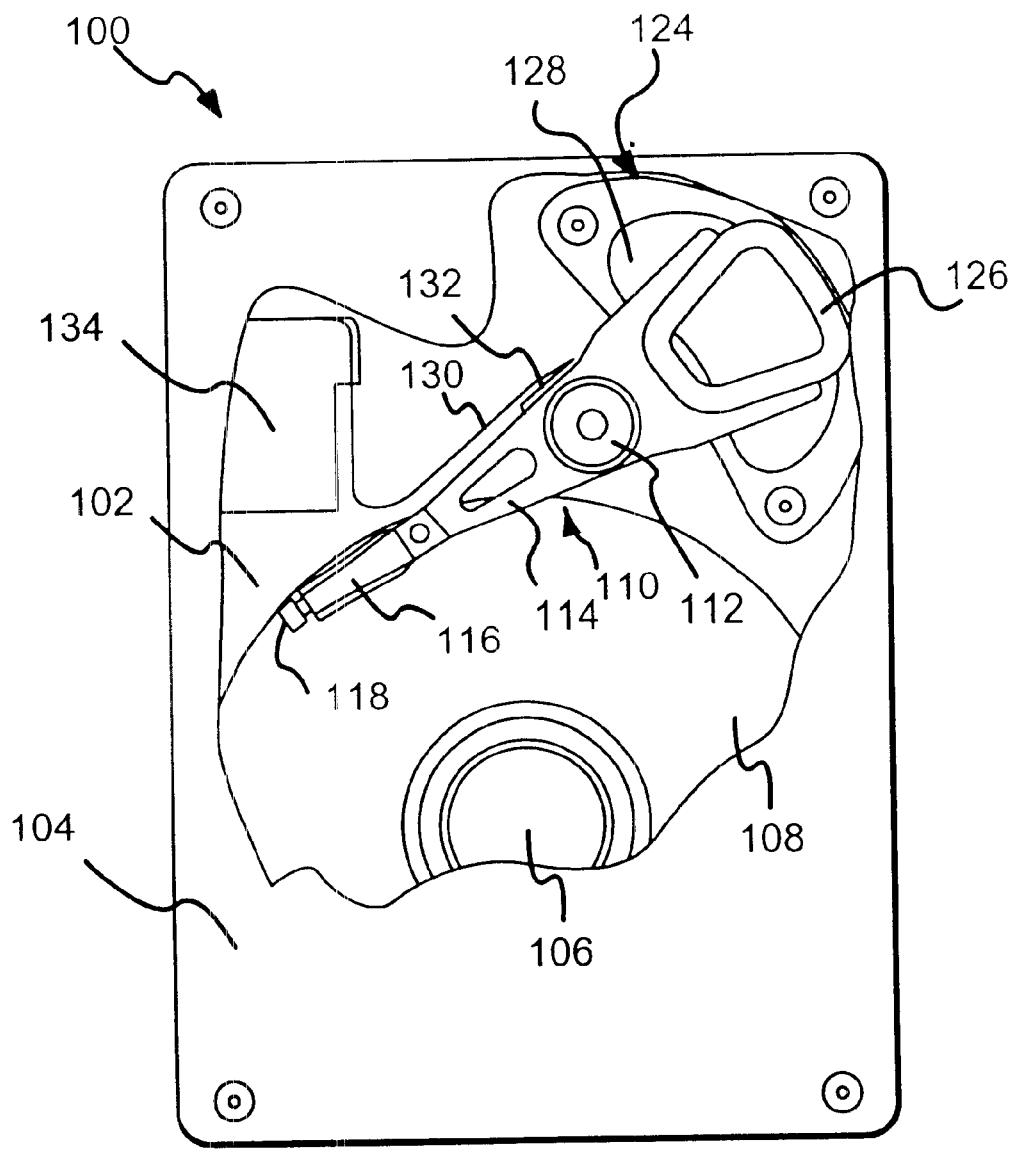
FIG. 1 is a plan view of a disc drive incorporating a preferred embodiment of the present invention showing the primary internal components.

Turning now to FIG. 1, shown therein is an exemplary disc drive 100 in which embodiments of the present invention may be incorporated. The disc drive 100 includes a base 102 to which various components of the disc drive 100 are mounted. A top cover 104, shown partially cut away, cooperates with the base 102 to form an internal, sealed environment for the disc drive in a conventional manner. The components include a spindle motor 106 that rotates one or more discs 108 at a constant high speed. Information is written to and read from tracks on the discs 108 through the use of an actuator assembly 110, which rotates during a seek operation about a bearing shaft assembly 112 positioned adjacent the discs 108. The actuator assembly 110 includes a plurality of actuator arms 114 that extend towards the discs 108, with one or more flexures 116 extending from each of the actuator arms 114. Mounted at the distal end of each of the flexures 116 is a head 118 that includes an air bearing slider enabling the head 118 to fly in close proximity above the corresponding surface of the associated disc 108.

During a seek operation, the position of the heads 118 is controlled through the use of a voice coil motor (VCM) 124, which typically includes a coil 126 attached to the actuator assembly 110, as well as one or more permanent magnets 128 that establish a magnetic field in which the coil 126 is immersed. The controlled application of current to the coil 126 causes magnetic interaction between the permanent magnets 128 and the coil 126 so that the coil 126 moves in accordance with the well known Lorentz relationship. As the coil 126 moves, the actuator assembly 110 pivots about the bearing shaft assembly 112, and the heads 118 are caused to move across the surfaces of the discs 108.

A flex assembly 130 provides the requisite electrical connection paths for the actuator assembly 110, while allowing pivotal movement of the actuator assembly 110 during operation. The flex assembly includes a printed circuit board 132 to which head wires (not shown) are connected; the head wires being routed along the actuator arms 114 and the flexures 116 to the heads 118. The printed circuit board 132 may include circuitry for controlling the write currents applied to the heads 118 during a write operation and a preamplifier for amplifying read signals generated by the heads 118 during a read operation. The flex assembly terminates at a flex bracket 134 for communication through the base 102 to a disc drive printed circuit board (not shown) mounted to the bottom side of the disc drive 100.

Figure 2:
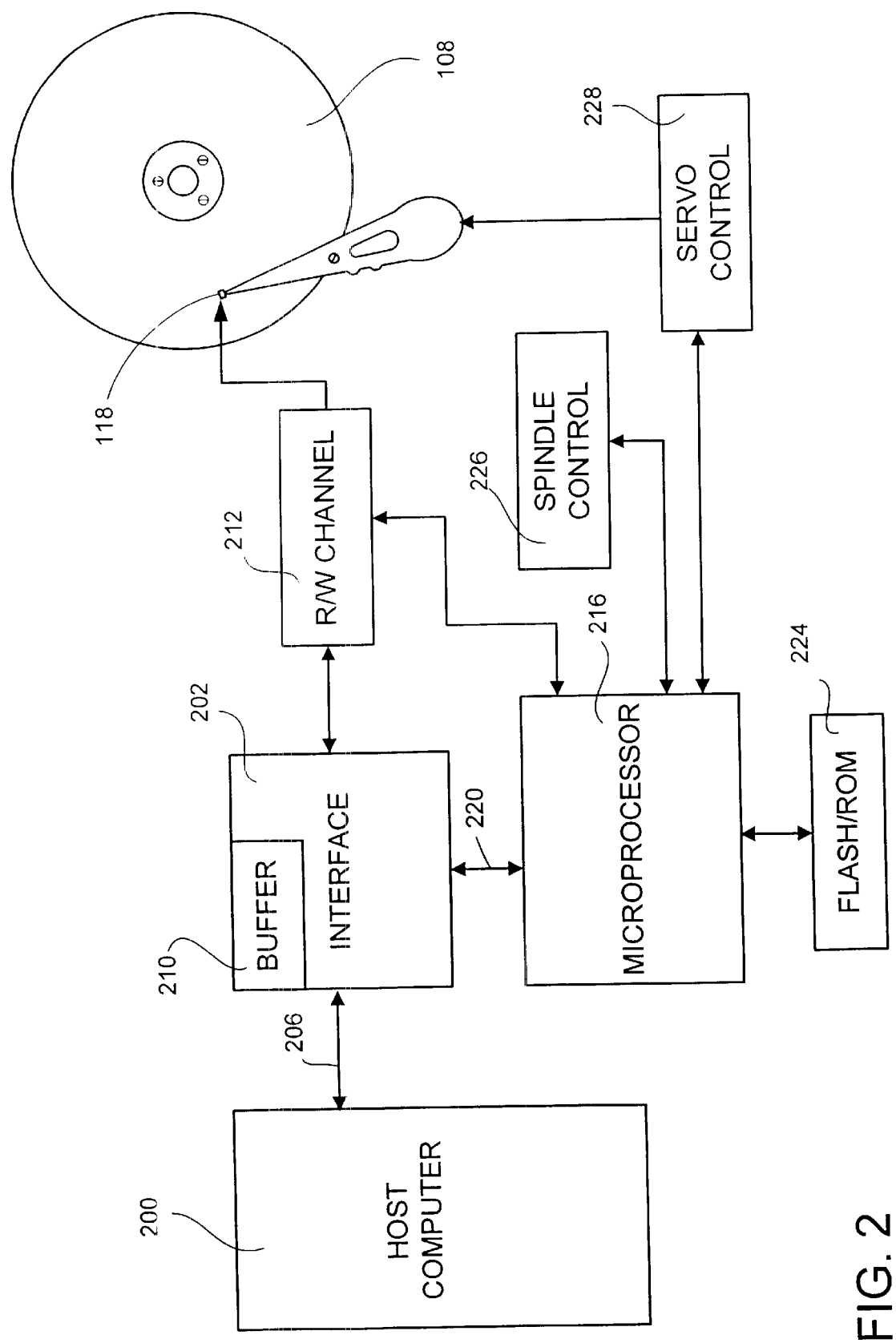
FIG. 2 is a functional block diagram generally showing the main functional components used to control the disc drive of FIG. 1.

Referring now to FIG. 2, shown therein is a generalized functional block diagram of the disc drive 100 of FIG. 1, illustrating some of the functional components of the disc drive 100. Some of these components may be resident on the disc drive PCB 140 and may be used to control the operation of the disc drive 100. As shown in FIG. 2, the disc drive 100 includes an interface application specific integrated circuit (interface) 202. The interface 202 may include an associated buffer 210 to facilitate high speed data transfer from a host computer or computers 200 to the disc drive 100. Data to be written to the disc drive 100 are passed via one or more data paths 206 to the interface 202 and then to a read/write channel 212, which encodes the data and provides the requisite write current signals to the heads 118. The manner in which data may be encoded and decoded by the read/write channel 212 is discussed below with respect to FIGS. 3, 4, and/or 5. To retrieve data that has been previously stored by the disc drive 100, read signals are generated by the heads 118 and provided to the read/write channel 212, which performs decoding and error detection and correction operations and outputs the retrieved data to the interface 202 for subsequent transfer to the computer 200.

As also shown in FIG. 2, a microprocessor 216 is operably connected 220 to the interface 202. The microprocessor 216 provides top level communication and control for the disc drive 100 in conjunction with programming for the microprocessor 216, which may be stored in a non-volatile microprocessor memory (MEM) 224. The MEM 224 can include random access memory (RAM), read only memory (ROM) and other sources of resident memory for the microprocessor 216. Additionally, the microprocessor 216 provides control signals for spindle control 226, and servo control 228.

Figure 3:
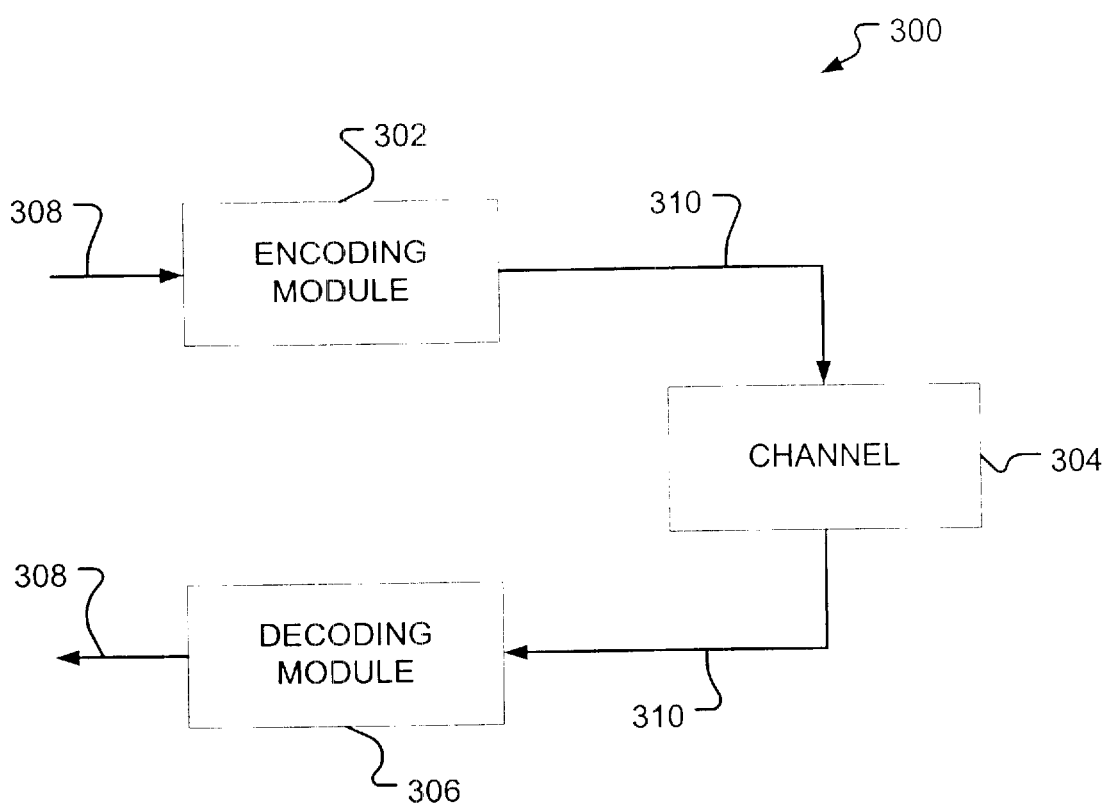
FIG. 3 illustrates a generalized communication system 300 including an encoder module, decoder module, and channel in accordance with various embodiments of the present invention.

FIG. 3 illustrates a generalized communication system 300 used with the present invention. The communications system includes an encoder module 302, a channel 304, and a decoder module 306. As will be appreciated, the communication system 300 may comprise, or be embodied in, any number of communications systems where data and clock signals are carried in the same signal. One such example is a disc drive, such as the disc drive 100 as shown in FIG. 1. With respect to the disc drive 100, the encoder module 302 and the decoder module 304 may be implemented in the R/W channel 212. Alternatively, the encoder module 302 and the decoder module 304 may be implemented in other hardware, software, or firmware within the disc drive 100. With respect to the disc drive 100, the channel may comprise the one or more discs 108.

Within the communication system 300, the encoder module 302 receives a stream 308 of one or more data words. The encoder module 302 then encodes the data words into a data stream 310 of code words in accordance with the encoding methods of the present invention, described in detail below. The stream of code words 310 is then transmitted to the channel 304, for transmission or storage. After transmission or storage, the stream of code words 310 is received at the decoder module 306, where they are then decoded to reproduce the stream of data words 308 in accordance with the decoding methods of the present invention, described in detail below.

FIGS. 4, 5, 6 and 7 illustrate operational flows exemplifying various methods related to encoding and decoding operations, in accordance with embodiments of the present invention. The operations shown in FIGS. 4, 5, 6 and 7 may be implemented (1) as a sequence of microprocessor implemented acts or program modules running on one or more microprocessors and/or (2) as interconnected machine logic circuits or circuit modules. For example, various of the operations shown in FIGS. 4, 5, 6 and 7 may be performed by or within the read/write channel 212 of the disc drive 100. Alternatively, the operations shown in FIGS. 4, 5, 6 and 7 may be implemented by other hardware, software or firmware in the communication system 300. Accordingly, the operations described may be referred to variously as operations, routines, structural devices, acts, or modules. The implementation of the operations shown in FIGS. 4, 5, 6, and 7 is a matter of choice dependent on performance requirements and/or hardware and software capabilities of the communication system 300. While some of the operations shown are preferably implemented as software stored on a computer readable medium, it will be recognized by one skilled in the art that these operations may be implemented in software, in firmware, in special purpose digital logic, or any combination thereof without deviating from the spirit and scope of the present invention, as recited in the claims attached hereto. As used herein, computer readable medium may be any available medium that can store or embody computer-readable instructions.

Figure 4:
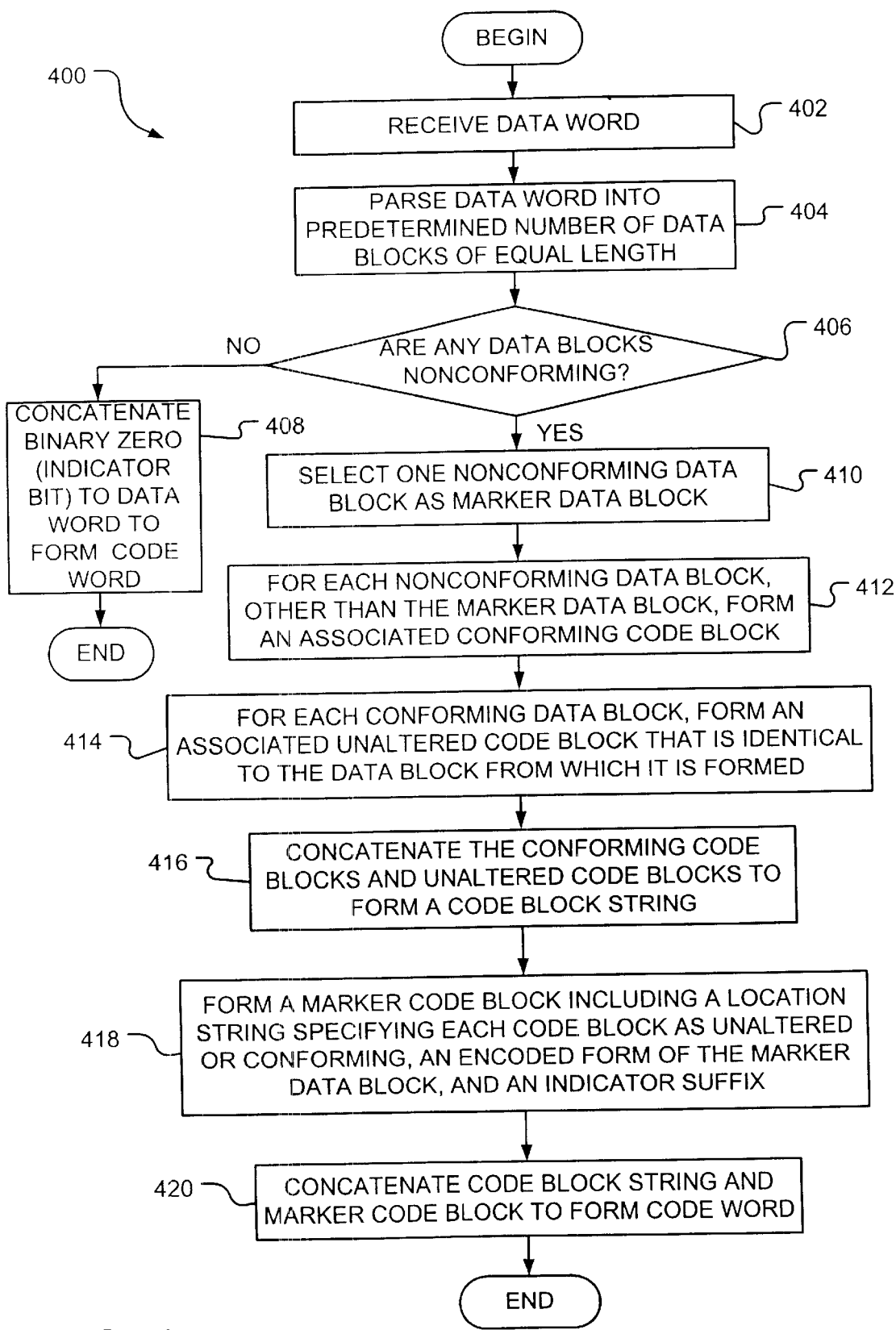
FIG. 4 is an operational flow chart illustrating various encoding operations that may be performed in accordance with an embodiment of the present invention.

Turning now to FIG. 4, shown therein is an operational flow diagram 400 illustrating various encoding operations that may be performed by the encoding module 302 in accordance with one embodiment of the present invention. As shown in FIG. 4, at the start of the encoding process, a signal embodying a digital data word is received 402 for encoding. As will be understood, the digital data word is composed of a series of binary ones (ones), binary zeros (zeros), or ones and zeros.

Following the receipt of the data word in receiving operation 402, a parsing operation 404 parses the received data word into a predetermined number of equal sized data blocks. The number of data blocks and the number of bits in each data block will be dependent on the size of the data word and the operational requirements of the communications system. In one embodiment, the number of data blocks (p) and the number of bits (q) in each data block will be selected to satisfy the following equation:

$$(q+1) > p + \text{ceil}(\log_2(q+1)) \qquad \text{Equation (1)}$$

That is, in this embodiment, for a data word of a given length (n), a pair (p, q) may be selected to satisfy Equation (1). It will be appreciated that for some values of n, there may be more than one (p, q) pair that satisfies equation (1). In such a case, the (p, q) pair may be selected so that a particular k-constraint is achieved in the resulting code word.

After the data word has been parsed 404, a determination operation 406 determines whether one or more of the data blocks are nonconforming data blocks, where nonconforming data blocks are data blocks not including at least two binary ones. Stated another way, determination operation determines if all of the data blocks are conforming data blocks. If it is determined that all of the data blocks are conforming data blocks, code word formation operation 408 forms a code word by concatenating a binary zero to the end of the data word, and the operational flow 400 ends. This binary zero is then used during decoding to indicate that the data word from which the code word was formed produced only conforming data blocks when parsed. As such, during the decoding process, all that is required to reproduce the data word is to simply remove the last bit of the code word. It should be understood that while the binary zero is placed at the end of the data word in this embodiment, the binary zero could be placed at other locations in, or relative to, the data word in, alternative embodiments.

If it is determined in the determination operation 406 that one or more of the data blocks are nonconforming data blocks, selection operation 410 selects one of the nonconforming data blocks as a marker data block. In one embodiment, the selection of the marker data block is carried out by examining each of the data blocks formed from the data word in the order that the data blocks were formed in the parsing operation 404. In this embodiment, the first nonconforming data block is selected as the marker data block. However, in other embodiments, the marker data block selected may be other than the first nonconforming data block.

Following the selection operation 410, a conforming code block formation operation 412 forms an associated conforming code block for each nonconforming data block, other than the marker data block. That is, for each nonconforming data block other than the marker data block, a corresponding code block is formed having at least two binary ones. Each conforming code block will preferably include the same number of bits as the data block from which it was formed. In one embodiment, each conforming code block is formed by complementing half of the data bits in its associated data block. However, other manners of forming conforming code blocks may be employed, so long as all of the conforming code blocks are formed in a consistent manner that can be reproduced or reversed in the decoding process, and which produces conforming code blocks having two or more binary ones.

Next, an unaltered code block formation operation 414 forms an unaltered code block for each conforming data block, where each unaltered code block is identical to the data block from which it was formed. After all conforming code blocks and unaltered code blocks in the code word have been formed, a string formation operation 416 concatenates each of the conforming blocks and unaltered code blocks together to form a code block string. In one embodiment, the order of the conforming blocks and unaltered code blocks in the code block string will be in the same order relative to one another as the relative order of their associated data blocks in the data word, with the exception of the marker data block.

Following the string formation operation 416, a marker code block forming operation 418 forms a marker code block containing a string "V" encoding the marker data block, a location string "L" specifying the location of the nonconforming data blocks in the data word, and an indicator suffix "I" that indicates that the data word from which the code word is formed includes at least one nonconforming data block.

In one embodiment, the string V comprises $\text{ceil}(\log_2(q+1))$ bits, where q is the number of bits in the parsed data blocks. For example, if the marker data block contains 8 bits, the marker code block will include $\text{ceil}(\log_2(8+1))$ bits, or ceil(3.16992500144231)=4 bits. Additionally, in this embodiment, the string V will preferably comprise a binary number indicating the location, if any, of the binary one in the marker data block. For example, and without limitation, in one embodiment if the marker data block does not include a binary one, and if the string V is of length 4, the string V would have the form of 0001, if a binary one is the first bit of the marker data block, the string V would have the form of 0010, if a binary one is the second bit of the marker data block, the string V would have the form of 0011, and so on.

With respect to the formation of the location string L, in one embodiment, the location of binary ones in the string L will directly correspond to the location of the nonconforming data blocks from the parsed data word. For example, if the data word were parsed into four data blocks, with the first and third data blocks being nonconforming data blocks, the string L would have the form 1010. As will be appreciated, in other embodiments, the location of the nonconforming data blocks from the parsed data word may be indicated in other manners than that just described, so long as the location of the nonconforming data blocks from the parsed data word can be determined from the string L in the decoding process.

As noted, the indicator suffix I indicates that the data word from which the code word was formed produced nonconforming data bits when parsed. The form of the indicator suffix I may vary. However, it is preferable that the indicator suffix I includes at least one binary one (indicator bit) at the end of the string. In this way, code words formed from data words that produced only conforming data blocks when parsed can be quickly distinguished from code words formed from data words that produced one or more nonconforming data blocks when parsed by simply examining the single indicator bit. In one embodiment, the indicator suffix I is formed of (q+1−|LV|) binary ones, where |LV| is the sum of the number of bits in string L and the number of bits in string V.

Following the marker code block forming operation 418, a code word formation operation forms a code word by concatenating the code block string and the marker code block, and the operational flow 400 ends. In one embodiment, the marker code block is concatenated to the end of the code block string. This facilitates easy location of the indicator suffix I (indicator bit) during the decoding process. In an alternative embodiment, the marker code block may be concatenated to the beginning of the code block string.

Figure 5:
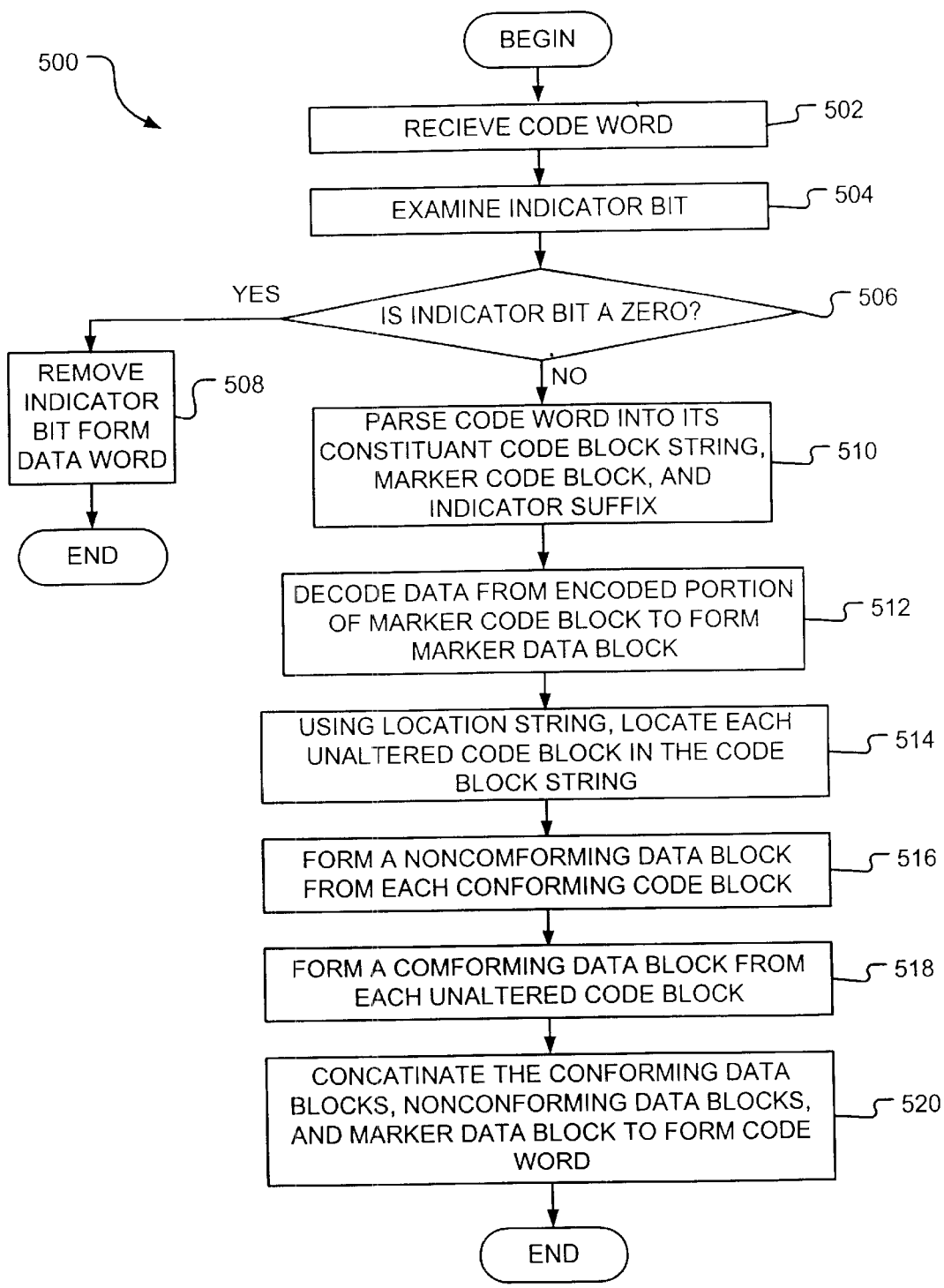
FIG. 5 is an operational flow chart illustrating various decoding operations that may be performed in accordance with another embodiment of the present invention.

Turing now to FIG. 5, shown therein is an operational flow diagram 500 illustrating various decoding operations that may be: performed by the decoding module 306 in accordance with one embodiment of the present invention. As shown in FIG. 5, at the start of the decoding process, a signal embodying a digital code word is received 502 for decoding. As will be understood, the digital code word will preferably have been formed by the encoder module 302, in accordance with the encoding process; described above with respect to FIG. 3. After receiving the code word, an examination operation 504 locates and examines the indicator bit. As previously described, in accordance with one embodiment, for ease of location, the indicator bit will be located as the last bit of the code word.

Next a determination operation 506 determines if the indicator bit is a binary zero. Put another way, the determination operation 506 determines if the code word was formed from a data word that produced only conforming data blocks when parsed. If the indicator bit is determined to be a binary zero, a data Word formation operation 508 removes the indicator bit to form the code word, and the operational flow 500 ends. If, however, the determination operation 506 determines that the indicator bit is a binary one, the operational flow 500 proceeds to a parsing operation 510.

During the parsing operation 510, the code word is parsed into its constituent code block string, marker code block, and indicator suffix. As will be appreciated, the manner in which the parsing occurs in the parsing operation 510 will be dependent on the manner and/or order in which these strings were concatenated during encoding. Next, the encoded data in the marker code block is decoded in decoding operation 512 to form the marker data block. The location of the coded form of the marker data block in the marker code block will be dependent on the manner in which the marker code block,was originally encoded, and during the encoding process.

Following the decoding operation 512, a location operation 514 uses the location string to locate each of the unaltered code blocks, if any, in the code block string. Next, a nonconforming data block formation operation 516 forms an associated nonconforming data block from each conforming code block located during location operation 514. The manner in which the associated nonconforming data blocks are formed will be dependent on the manner in which the conforming code block was formed during the encoding process.

Next, a conforming data block formation operation 518 forms an associated conforming data block from each unaltered code block located during location operation 514. A data word formation operation 520 then forms a data word by concatenating the conforming data blocks, nonconforming data blocks, and the marker block. The manner and order in which these blocks are concatenated to form the code word will be dependent on the manner order in which their associated code blocks were formed during the encoding of the code word. As will be appreciated, the manner and order in which the conforming data blocks, nonconforming data blocks, and the marker block are concatenated will be such that the data word produced will be identical, with possible exception of unintended errors, to the data word from which the code word was formed. Following the formation operation 520, the operational flow 500 ends.

Figure 6:
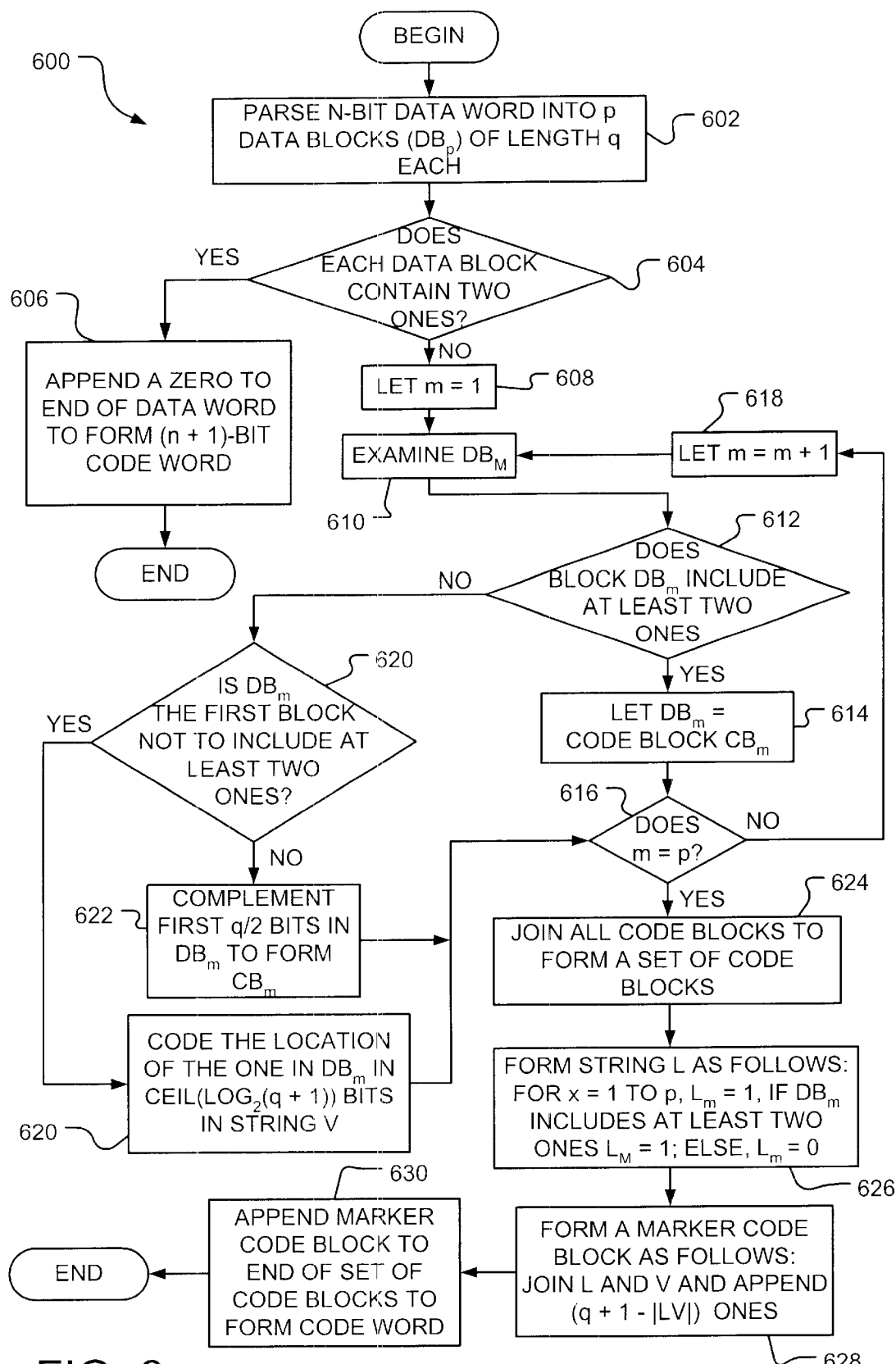
FIG. 6 is an operational flow chart illustrating various encoding operations that may be performed in accordance with another embodiment of the present invention.

Turning now to FIG. 6, shown therein is an operational flow diagram 600 illustrating various encoding operations that may be performed by the encoding module 302 in forming a code word from a data word. More particularly, FIG. 6 illustrates operations that may be performed in forming an (n+1)-bit code word from an n-bit data word, in accordance with one embodiment of the present invention. As shown in FIG. 6, at the start of the encoding process, after an n-bit data word has been received, a parsing operation 602 parses the n-bit data word into a predetermined number (p) of data blocks (DBp), each of a predetermined length (q). In accordance with one embodiment, the number of data blocks (p) and the number of bits (q) in each data block will be selected to satisfy Equation (1), as set forth above. The order of the formation of the data blocks will preferably be sequential, with the first q data bits in the data word being designated $DB_1$, the second q data bits in the data word being designated $DB_2$, and so on, with the last q data bits in the data word being designated $DB_p$.

Following the parsing operation 602, a first determination operation 604 determines whether each of the data blocks formed in parsing operation 602 includes at least two binary ones. If it is determined that each of the data blocks formed in parsing operation 602 does include at least two binary ones, the operational flow 600 proceeds to code word formation operation 606. The code word forming operation 606 then forms the (n+1)-bit code word by appending a single binary zero to the end of the data word. If, however, it is determined that each of the data blocks formed in parsing operation 602 does not include at least two binary ones, the operational flow 600 proceeds to a first variable set operation 608, where a counter variable (m) is set to 1.

Following the set operation 608, an examination operation 610 examines data block $DB_m$. Next, a second determination operation 612 determines whether data block $DB_m$ includes at least two binary ones. If it is determined that data block $DB_m$ includes at least two binary ones, the operational flow 600 proceeds to a code block formation operation 614, where a data block $CB_m$ is formed that is identical to data block $DB_m$. Next, a third determination operation 616 determines whether the counter variable m is equal to p. If it is determined that the counter variable m is not equal to p, the operational flow 600 proceeds to a second variable set operation 618, where the counter variable (m) is set to m+1.

The operational flow 600 then proceeds back to the examination operation 610.

Returning to the second determination operation 612, if it is determined therein that data block $DB_m$ does not include at least two binary ones, the operational flow 600 proceeds to a fourth determination operation 620, where it is determined whether data block $DB_m$ is the first data block examined during examination operation 610 not to include at least two binary ones. If it is determined that data block $DB_m$ was the first data block examined during examination operation 610 not to include at least two binary ones, the operational flow 600 proceeds to a coding operation 620, where the location of the binary one, if any, in data block $DB_m$ is coded into a string (V) having ceil($\log_2(q+1)$) bits, where q is the number of bits in the parsed data blocks. In this embodiment, the string V will preferably comprise a binary number indicating the location, if any, of the binary one in the data block $DB_m$. For example, and without limitation, in one embodiment if the marker data block does not include a binary one, and if the string V is of length 4, the string V would have the form of 0001, if a binary one is the first bit of the marker data block, the string V would have the form of 0010, if a binary one is the second bit of the marker data block, the string V would have the form of 0011, and so on. Following the coding operation 620, the operational flow 600 proceeds to the third determination operation 616, described previously.

Returning to the fourth determination operation 620, if it is determined therein that data block $DB_m$ is not the first data block examined during examination operation 610 to include at least two binary ones, the operational flow 600 proceeds to a complement operation 622, where a code block $CB_m$ is formed by complementing the first q/2 bits of data block $DB_m$. Following the complement operation 622, the operational flow 600 proceeds back to the third determination operation 616, described previously.

As previously described, if it is determined in the third determination operation 616 that the counter variable m is not equal to p, the operational flow 600 proceeds to the second variable set operation 618. However, if it is determined in the third determination operation 616 that the counter variable m is equal to p, the operational flow 600 then proceeds to a code block joining operation 624, where each of the code blocks, other than the code block from which string V was formed, are joined to form a set of code blocks. Preferably, the joining operation 624 will join the code blocks in the order that they were formed in code block formation operation 614.

Following the joining operation 624, a string formation operation 626 forms a string (L), that is indicative of the location within the set of code blocks of each of the code blocks that were formed from data blocks not including at least two binary ones. In this embodiment, the string L may be formed as follows: for each data block $DB_M$ examined in examination operation 610, for x=1 to p, let $L_x$=1, if $DB_M$ included at least two ones, else let $L_x$=0, if $DB_M$ did not included at least two ones.

Following the string formation operation 626, a marker code block formation operation forms a marker code block by joining string V to the end of string L, and then appending (q+1-|LV|)binary ones to the end of string L, where |LV| is the sum of the number of bits in string L and the number of bits in string V. Next, a code word formation operation 630 forms the (n+1)-bit code word by appending the marker code block to the end of the set of code blocks. Following the code word formation operation 630, the operational flow 600 ends.

Figure 7:
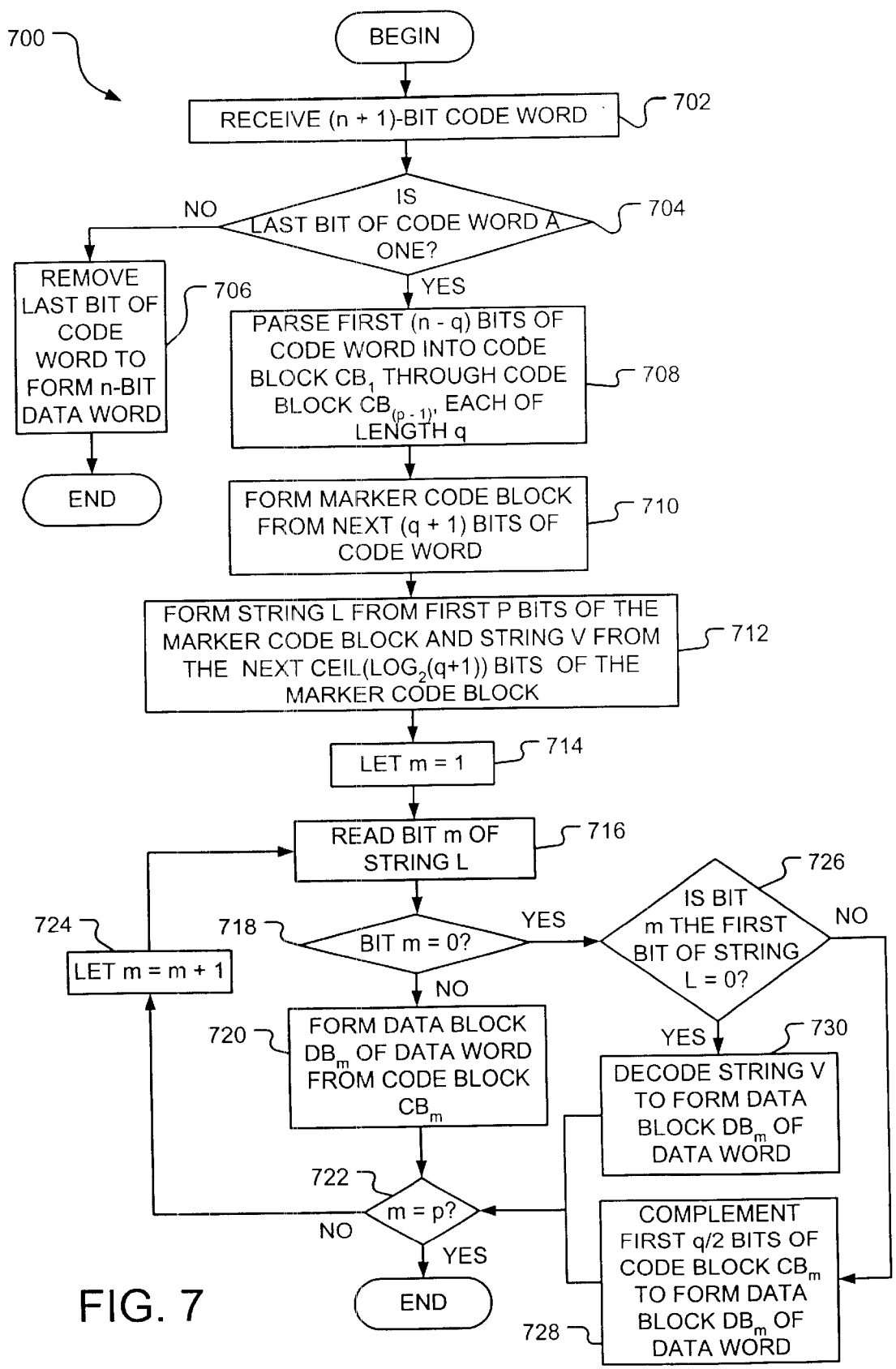
FIG. 7 is an operational flow chart illustrating various decoding operations that may be performed in accordance with another embodiment of the present invention.

Turing now to FIG. 7, shown therein is an operational flow diagram 700 illustrating various decoding operations that may be performed by the decoding module 306 in accordance with another embodiment of the present invention. As shown in FIG. 7, at the start of the decoding process, a signal embodying a digital code word having (n+1)-bits is received 702 for decoding. As will be understood, the digital code word will preferably have been formed by the encoder module 302, in accordance with the encoding process described above with respect to FIG. 6.

After receiving the code word, a first determination operation 704 determines whether the last bit of the received code word is a binary one. If it is determined that the last bit of the received code word is not a binary one, the operational flow 700 proceeds to a data word formation operation 706 where an n-bit data word is formed by removing the last bit from the received code word. Following the data word formation operation 760, the operational flow 700 ends.

Returning to the first determination operation 704, it is determined therein that the last bit of the received code word is a binary one, a parsing operation 708 then parses the first (n–q) bits of the code word into code blocks $CB_1$ through $CB_{(p-1)}$, each code block having a length q. Next, a marker code block formation operation 710 form a marker code block from the next (q+1) bits of the code word. That is, the marker code block is formed from the (q+1) bits following the first (n+q) bits. Following the marker code block formation operation 710, a string formation operation 712 then forms a string L from the first p bits of the marker code block and a string V from the next ceil($\log_2(q+1)$) bits of the marker code block.

After the string formation operation 712, a first variable set operation 714, sets a counter variable (m) equal to 1. Next, a read operation 716 reads bit m of string L. A second determination operation 718 then determines if bit m of string L is a binary zero. If it is determined that bit m of string L is a binary zero, the operational flow 700 proceeds to a data formation operation 720, where the $m^{th}$ data block $DB_m$ of the decoded data word is formed from the code block $CB_m$ formed during parsing operation 708. Next, a third determination operation 722 determines if the variable m is equal to p. If it is determined that the variable m is equal to p, the operational flow 700 ends. However, if it is determined that the variable m is not equal to p, the operational flow 700 proceeds to a second variable set operation 724, where the counter variable m is set equal to m+1. The data flow 700, then proceeds back to read operation 716, previously described.

Returning to the second determination operation 718, if it is determined therein that bit m of string L is not a binary zero, the operational flow 700 proceeds to a fourth determination operation 726, where it is determined whether bit m of string L is the first bit binary one in string L. If it is determined that bit m of string L is not the first bit binary one in string L, the operational flow 700 proceeds to a complementing operation 728, where the first q/2 bits of the code block $CB_m$ are complemented to form data the $m^{th}$ data block $DB_m$ of the decoded data word from the code block $CB_m$ formed during parsing operation 708. The data flow 700, then proceeds back to the third determination operation 722, previously described.

Returning to the fourth determination operation 726, if it is determined therein that bit m of string L is the first bit binary one in string L, the operational flow 700 proceeds to a string decoding operation 730, where string V is decoded to form the $m^{th}$ data block $DB_m$ of the decoded data word. In this embodiment, the decoding operation 730 forms the $m^{th}$ data block $DB_m$ by reading the string V as a binary number. The binary number then indicates the location, if any, of a binary one in the string of bits that form the $m^{th}$ data block $DB_m$. For example, if the string V is of length 4, the binary number 1 would indicate that data block $DB_m$ includes only binary zeros (00000000), the binary number 2 would indicate that block $DB_m$ includes only a single binary one as the first bit in the data block $DB_m$ (10000000), the binary number 2 would indicate that block $DB_m$ includes only a single binary one as the second bit in the data block $DB_m$ (01000000), and so on.

Following the decoding operation 730, the operational flow 700 proceeds to the third determination operation 722, previously described. Again, if it is determined therein that m does not equal p, the operation flow proceeds to the second variable set operation 724. However, if it is determined in the third determination operation 722 that m does equal p, the operation flow 700 ends.

In summary, in view of the foregoing discussion it will be understood that a first embodiment of the present invention relates to a method of forming binary code words from binary data words. In accordance with this embodiment a binary data word is parsed into a predetermined number of data blocks, each data block being either a conforming data block having at least two bits of a first type or a nonconforming data block having less than two bits of the first type (such as 602). An associated conforming code block including at least two data bits of the first type is then formed for each nonconforming data block (such as 616 or 626). An associated unaltered code block, which is identical to the data block from which it was formed, is then formed for each conforming data block (such as 616). A binary code word is then formed from the conforming code blocks and the unaltered code blocks (such as 628). In accordance with one embodiment, the first type of data bit represents a binary one.

Another embodiment of the present invention comprises a method of decoding a binary code word to form a binary data word. In accordance with this embodiment, a binary code word is received and parsed into conforming code blocks and unaltered code blocks (such as 708). A nonconforming data block is then formed from each of the conforming code blocks (such as 728 or 730). A conforming data block is then formed from each unaltered code block (such as 720). The binary data word is then formed by joining the nonconforming data blocks and the conforming data blocks together.

Yet another embodiment of the present invention comprises a data encoder for forming an (n+1)-bit binary code word from an n-bit binary data word. Included in the data encoder is a parsing means (such as 404) for parsing the n-bit binary data word into p data blocks, each of the data blocks being either a conforming data block having at least two bits of a first type or a nonconforming data block having less than two bits of the first type. Also included in the data encoder is an altering means (such as 412) for altering each nonconforming data block to form an associated conforming code block having at least two bits of the first type. The data encoder also includes a code word forming means (such as 416, 418, and 420 ) for combining all conforming data blocks together with a single indicator bit of the first type to form the (n+1)-bit binary code word, if each of the data blocks is a conforming data block, and combining all code blocks together to form the (n+1)-bit binary code word, if at least one of the data blocks is a nonconforming data block.

It will be clear that the present invention is well adapted to attain the ends and advantages mentioned as well as those inherent therein. While a presently preferred embodiment has been described for purposes of this disclosure, various changes and modifications may be made that are well within the scope of the present Invention. For example, various operations illustrated and described with respect to the operational flows illustrated in FIGS. 4, 5, 6, and 7 may be performed in orders other than the orders illustrated in these FIGS. Numerous other changes may be made that will readily suggest themselves to those skilled in the art and that are encompassed in the spirit of the invention disclosed and as defined in the appended claims.

What is claimed is:

1. A method of forming a binary code word from a binary data word, comprising steps of:

(a) receiving the binary data word;

(b) parsing the binary data word into a predetermined number of data blocks, each data block being either a conforming data block having at least two bits of a first type or a nonconforming data block having less than two bits of the first type;

(c) for each nonconforming data block, forming an associated conforming code block including at least two data bits of the first type;

(e) for each conforming data block, forming an associated unaltered code block that is identical to the data block from which it was formed; and (f) forming the binary code word from the conforming code blocks and the unaltered code blocks.

2. The method of claim 1, wherein the first type of data bit represents a binary one.

3. The method of claim 1, wherein binary data word comprises n bits and the binary code word comprises (n+1) bits.

4. The method of claim 1, wherein one of the conforming code blocks is a marker code block that includes an encoded form of the data block from which it was formed.

5. The method of claim 4, wherein the marker code block further includes a string identifying each code block as either conforming or unaltered.

6. The method of claim 5, wherein the marker code block further includes an indicator suffix indicating that the code word includes conforming code blocks.

7. The method of claim 4, wherein the marker code block is the last code block in the code word.

8. The method of claim 1, wherein one of the conforming code blocks is a marker code block that includes an encoded form of the data block from which it was formed and an indicator suffix indicating that the code word includes conforming code blocks.

9. The method of claim 4, wherein the encoded form of the marker data block comprises a binary number indicating the location of a bit of the first type, if any, in the nonconforming data block from which the marker block was formed.

10. The method of claim 4, wherein each of the data blocks includes a number q of bits, and wherein each of the altered code blocks other than the marker code block is formed by complementing the first q/2 bits in its associated data block.

11. The method of claim 1, wherein the length of the binary code word is (n+1), and wherein the predetermined number (p) of data blocks and the length (q) of each data block satisfy the equation $(q+1)>p+\text{ceil}(\log_2(q+1))$.

12. A method of decoding a binary code word to form a binary data word, comprising steps of:

(a) receiving the binary code word;
(b) parsing the binary code word into conforming code blocks and unaltered code blocks, each code block including a plurality of bits;
(c) forming a nonconforming data block from each conforming code block;
(d) forming a conforming data block from each unaltered code block; and
(e) concatenating nonconforming data blocks and conforming data blocks to form the binary data word.

13. The method of claim 12, wherein the binary code word comprises (n+1) bits and the binary data word comprises n bits.

14. The method of claim 12, wherein the forming step (c) further comprises:
(c)(1) selecting a marker code block from the conforming code blocks;
(c)(2) forming a nonconforming data block from data encoded in the marker code block;
(c)(3) for each code block other than the marker code block, forming a nonconforming data block by complementing one or more bits of the conforming code block.

15. The method of claim 12, wherein the forming step (c) includes a step of:
(c)(1) forming at least one nonconforming data block by complementing half of the bits in at least one conforming code block.

16. The method of claim 12, wherein one of the parsed conforming code blocks is a marker code block including an encoded form of the marker data block.

17. The method of claim 12, wherein the marker code block also includes an indicator bit indicating that the binary code word includes at least one conforming code block.

18. A data encoder for forming an (n+1)-bit binary code word from an n-bit binary data word, comprising:
parsing means for parsing the n-bit binary data word into p data blocks, each of the data blocks being either a conforming data block having at least two bits of a first type or a nonconforming data block having less than two bits of the first type;
altering means for altering each nonconforming data block to form an associated conforming code block having at least two bits of the first type; and
code word forming means for combining all conforming data blocks together with a single indicator bit of the first type to form the (n+1)-bit binary code word, if each of the data blocks is a conforming data block, and combining all code blocks together to form the (n+1)-bit binary code word, if at least one of the data blocks is a nonconforming data block.

19. The data encoder of claim 18, wherein the first type of data bit represents a binary one.

20. The data encoder of claim 18, wherein the altering means is operable to form one of the conforming code blocks as a marker block, wherein the marker includes a string of bits indicative of the location of bits of the first type, if any, within its associated nonconforming data block.

21. The data encoder of claim 18, wherein the altering means is operable to form one of the conforming code blocks as a marker block, wherein the marker includes a single indicator bit of the first type and a string of bits indicative of the location of bits of the first type, if any, within the its associated nonconforming data.

22. The data encoder of claim 18, wherein the altering means is operable to form one of the conforming code blocks as a marker block, wherein the marker includes a single indicator bit of the first type, a string of bits indicative of the location of bits of the first type, if any, within the its associated nonconforming data, and a location string indicating which of the code blocks in the code word are conforming code blocks.

23. The data encoder of claim 18, wherein the altering means is operable to form each conforming code block, other than the marker block, by complementing the first q/2 bits of its associated nonconforming data block.

24. A method of forming (n+1)-bit binary code words from n-bit binary data words, comprising steps of:
(a) receiving an n-bit binary data word;
(b) parsing the n-bit binary data word into a predetermined number of q-bit data blocks, each of the q-bit data blocks being either a conforming data block having at least two bits of a first type or a nonconforming data block having less than two bits of the first type;
(c) if each of the data blocks is a conforming data block, combining all of the conforming data blocks together with a single indicator bit of a first type to form an (n+1)-bit binary code word; and
(d) if any of the data blocks are nonconforming data blocks;
(d)(1) altering each nonconforming data block in a predetermined manner to form a conforming code block having at least two bits of the first type;
(d)(2) for each conforming data block, forming an identical unaltered code block; and
(d)(3) combining all of the code blocks together with an indicator string having at least one bit of a second type to form an (n+1)-bit binary code word.

25. The method of claim 24, wherein the altering step (d)(1) comprises:
(d)(1)(i) selecting a first nonconforming data block and forming conforming code block including a first string of bits indicative of the location of bits of the first type, if any, within the first nonconforming data block; and
(d)(1)(ii) for every nonconforming data block other than the first nonconforming data block, forming an associated code block by complementing the first q/2 bits of the nonconforming data block.

* * * * *